(12) United States Patent
Lim et al.

(10) Patent No.: US 6,498,526 B2
(45) Date of Patent: Dec. 24, 2002

(54) FUSE CIRCUIT AND PROGRAM STATUS DETECTING METHOD THEREOF

(75) Inventors: Kyu-Nam Lim, Suwon (KR); Sang-Seok Kang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/816,874

(22) Filed: Mar. 23, 2001

(65) Prior Publication Data

US 2002/0008544 A1 Jan. 24, 2002

(30) Foreign Application Priority Data

Mar. 23, 2000 (KR) .......................................... 2000-14798

(51) Int. Cl.$^7$ ............................................. H01L 29/00
(52) U.S. Cl. ......................................... 327/525; 327/51
(58) Field of Search ................................. 327/525, 563, 327/51, 50, 55

(56) References Cited

U.S. PATENT DOCUMENTS

| | | | | |
|---|---|---|---|---|
| 4,210,875 A | * | 7/1980 | Beasom | 330/261 |
| 4,446,534 A | | 5/1984 | Smith | 365/96 |
| 5,353,028 A | * | 10/1994 | de Wit et al. | 341/172 |
| 5,789,970 A | * | 8/1998 | Denham | 327/525 |
| 5,953,279 A | | 9/1999 | Kim et al. | 365/225.7 |
| 6,346,738 B1 | * | 2/2001 | Kim et al. | 257/529 |

* cited by examiner

Primary Examiner—Dinh T. Le
(74) Attorney, Agent, or Firm—Marger Johnson & McCollom, PC

(57) ABSTRACT

A fuse circuit according to the present invention includes fuse elements each connected to first and second nodes, a sense circuit for sensing a difference of currents flowing through the fuse elements, and an amplifier circuit for amplifying voltages of the first and second nodes with rail-to-rail voltages, respectively. By this configuration, the resistor difference of the fuse elements is sensed by a current difference, thus whether a fuse element is programmed is exactly sensed regardless of capacitive parasitic loading of the respective nodes.

21 Claims, 4 Drawing Sheets

FUSE CIRCUIT AND PROGRAM STATUS DETECTING METHOD THEREOF

This application relies from priority upon Korean Patent Application No. 2000-14798, filed on Mar. 23, 2000, the contents of which are herein incorporated by reference in their entirety.

FIELD OF THE INVENTION

The present invention is related to semiconductor devices, and more particularly to semiconductor fuses.

BACKGROUND OF THE INVENTION

For many years fuses have been used in semiconductor circuits for a variety of purposes. For example, memory circuits typically use fuses to implement memory redundancy. Word line redundancy hardware exists to replace inoperable bit cells or word lines at manufacturing test. The effect of using memory redundancy is to increase effective yield. The improvement in yield is accomplished by programming fuses or fuse circuits to remain conductive or to become electrically open depending upon what memory circuit is needed. Another common use of fuse technology in semiconductors is to implement electronic chip identification. Chip identification is accomplished by uniquely identifying the source of each chip including a lot, a wafer, and an X/Y coordinate location on a wafer so that a manufacturer can easily retrieve and report process data for a given integrated circuit.

Fuses have commonly been implemented in semiconductors with either polysilicon or metal. Metals which have been used in the past include aluminum and tungsten. Regardless of the material used to implement the fuse, programming circuitry is required in order to control whether or not the fuse has been blown and to indicate the status of the fuses conductivity. Such examples of a fuse circuit, which is programmable, are disclosed in U.S. Pat. No. 4,446,534 entitled "Programmable Fuse Circuit" and in U.S. Pat. No. 5,953,279 entitled "Fuse Option Circuit For Memory Device". Semiconductor fuses are typically made non-conductive either by application of a large voltage (relative to power supply voltage magnitude) or by use of laser light. In either event, a circuit is required to indicate the existing status of whether or not the fuse has successfully been made nonconductive.

A conventional fuse circuit, which is used in the art, is illustrated in FIG. 1. A fuse circuit 10 includes a first fuse resistor element 14, which is connected between a node marked with Vcc through a PMOS transistor 12 and a node marked with ND1. A second fuse resistor element 18 is connected between the node Vcc through a PMOS transistor 16 and a node marked with ND2. The PMOS transistors 12 and 16 have their gates or control electrodes connected to receive a signal PEFE in common. An NMOS transistor 20 has a drain or a first electrode connected to the node ND 1, a source or a second electrode connected to a ground voltage, and a gate connected to the node ND2. An inverter 24 has an input connected to the node ND2 and an output for providing a signal marked with "FUSE OUT". An NMOS transistor 26 for programming a fuse has a drain connected to the node ND 1, a source connected to the ground voltage, and a gate connected to receive a fuse program pulse signal FCUT.

In FIG. 1, the fuse resistor element 14 is an electrically programmable fuse, and the fuse resistor element 18 acting as a resistor is configured so as to have larger resistor value than that of the fuse resistor element 14 when the fuse resistor element 14 is at an intact state (or a conductive state). On the other hand, the fuse resistor element 18 is configured so as to less resistor value than that of the fuse resistor element 14 when the fuse resistor element 14 is at a non-conductive state.

Although programmed by application of a large voltage, an electrically programmable fuse either is not cut perfectly or is again connected by various causes after being cut. Substantially, after a program operation is carried out, the electrically programmable fuse has an increased resistor value as compared with that before programming. A problem of the fuse circuit in FIG. 1 using such characteristic is that, although the resistor value of the fuse resistor element 14 is increased over that before a program operation (i.e., although it is larger than a resistor value of the fuse resistor element 18), the output signal FUSE OUT is maintained at a logic high level set before the program operation regardless of the program operation. A more detailed description is as follow.

In the fuse circuit 10 of FIG. 1, latch circuit consisting of the NMOS transistors 20 and 22 senses a resistor difference between the fuse resistor elements 14 and 18 as a voltage difference between the nodes ND1 and ND2. For example, in a case where a resistor value of the fuse resistor element 14 is less than that of the fuse resistor element 18 (that is, before the fuse resistor element 14 is programmed), the nodes ND1 and ND2 are set to a logic low level and a logic high level by a latch operation of the NMOS transistors 20 and 22 at power-up, because capacitive parasitic loading of the node ND1 is less than that of the node ND2.

Then, in the case that the resistor value of the fuse resistor element 14 is larger than that of the fuse resistor element 18 (that is, after the fuse resistor element 14 is programmed), the nodes ND1 and ND2 may be set to a logic high level and a logic low level. But, the nodes ND1 and ND2 are maintained at logic states before programming. This is because voltages of the node ND1 and ND2 are determined not by a resistor difference between the fuse resistor elements 14 and 18, but by capacitive parasitic loading of the respective nodes ND1 and ND2. Therefore, although a resistor value of the fuse resistor element 14 is varied (or increased) before and after programming, the fuse circuit 10 outputs the signal FUSE OUT of a logic low level indicating that the fuse resistor element 14 is not programmed.

As a result, the voltages of the nodes ND1 and ND2 of the fuse circuit 10, which senses a resistor difference of the elements 14 and 18, are determined (or fixed) according to capacitive parasitic loading of the respective nodes ND1 and ND2 regardless of a program operation of the fuse resistor element 14. Therefore, the fuse circuit 10 has a shortcoming indicating a conductive state of the fuse resistor element 14 at an output of the inverter 24 after the fuse resistor element 14 is substantially programmed. This causes a reliability problem.

SUMMARY OF THE INVENTION

It is therefore an object of the invention to provide a fuse circuit and a program status detecting method thereof, which are capable of improving a reliability of an electrically programmable fuse.

This and other objects, advantages and features of the present invention are provided by fuse option circuit that comprises a first fuse element having first and second terminals, wherein the first terminal of the first fuse element is connected to a first power terminal; a second fuse element having first and second terminals, wherein the first terminal of the second fuse element is connected to the first power terminal; first and second nodes connected to the second terminals of the first and second fuse elements, respectively; means for sensing a difference of currents flowing through the first and second fuse elements, wherein the sensing means determines voltages of the first and second nodes depending on the current difference thus sensed; and means for amplifying voltages of the first and second nodes either to voltages of the first and second power terminals or to voltages of the second and first power terminals, respectively.

In this embodiment, the sensing means comprises a first transistor coupled between the first node and the second power terminal; and a second transistor coupled between the second node and the second power terminal, wherein the first and second transistors are simultaneously switched on/off according to a control pulse signal.

In this embodiment, the amplifying means comprises a third transistor which has a current path formed between the first node and the second power terminal and a gate electrode coupled to the second node; and a fourth transistor which has a current path formed between the second node and the second power terminal and a gate electrode coupled to the first node, wherein the third and fourth transistors serve as a latch circuit.

BRIEF DESCRIPTION OF THE DRAWINGS

A more complete appreciation of the present invention, and many of the attendant advantages thereof, will become readily apparent as the same becomes better understood by reference to the following detailed description when considered in conduction with the accompanying drawings in which like reference symbols indicate the same or similar components, wherein.

DESCRIPTION OF THE PREFERRED EMBODIMENT

Figure 1:
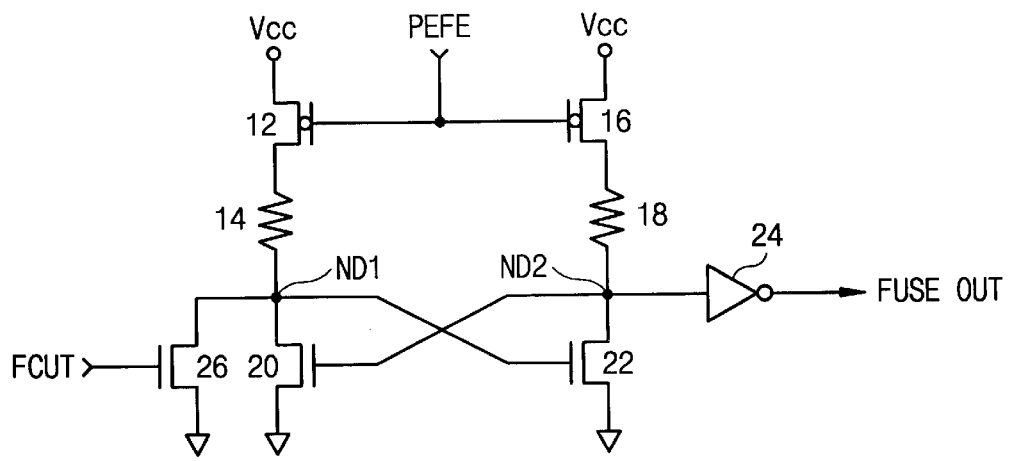
FIG. 1 is a circuit diagram of a conventional fuse circuit.

The preferred embodiment of the invention will be more fully described with reference to the attached drawings.

Fuse circuits according to preferred embodiments of the present invention sense a resistor value variation of an electrically programmable fuse element using a fuse element acting as a resistor, and output a sense result as a signal indicating that the electrically programmable fuse element is programmed. As described above, it is very difficult to secure a reliability of the electrically programmable fuse element. A preferred embodiment of a fuse circuit that is capable of improving the reliability is illustrated in FIG. 2.

The fuse circuit 100 of the present invention comprises a first fuse resistor element 102 and a second fuse resistor element 104, which are realized so as to have different resistor values. For example, before programming, a resistor value of the fuse resistor element 102 is realized less than that of the fuse resistor element 104. Each of the fuse resistor elements 102 and 104 has a first terminal connected to a node marked with $V_{EXT}$. A PMOS transistor 106 has a drain connected to a node marked with ND10 and a source connected to a second terminal of the fuse resistor element 102 opposite to the node $V_{EXT}$. A PMOS transistor 108 whose gate is connected to the node ND10 has a source connected to a second terminal of the fuse resistor element 104 opposite to the node $V_{EXT}$ and a drain connected to a node marked with ND20. A gate of the PMOS transistor 106 is connected to the node ND20. An NMOS transistor 110 has a drain connected to the node ND10, a source connected to the ground voltage and a gate connected to the node ND20. A gate of the NMOS transistor 112 is connected to the node ND10, its drain is connected to the node ND20, and its source is grounded. The transistors 106, 108, 110 and 112 form a complementary latch circuit as illustrated in FIG. 2.

An NMOS transistor 114 has a drain connected to the node ND10, a source grounded and a gate connected to receive a control pulse signal of an active high MRS1. An NMOS transistor 116 has a drain connected to the node ND20, a source grounded and a gate connected to receive the control pulse signal MRS1. An NMOS transistor 120 for programming a fuse has a drain connected to the second terminal of the fuse resistor element 102, a source connected to the ground voltage, and a gate connected to receive a fuse program pulse signal of an active high MRS2. An inverter 118 has an input connected to the node ND20 and an output for providing a signal marked with "FUSE OUT". The signals MRS1 and MRS2, for example, are signals generated from a well-known mode register set circuit of a semiconductor memory device, and are generated at various points of operation of a semiconductor memory (or a system) or after power-up.

Figure 2:
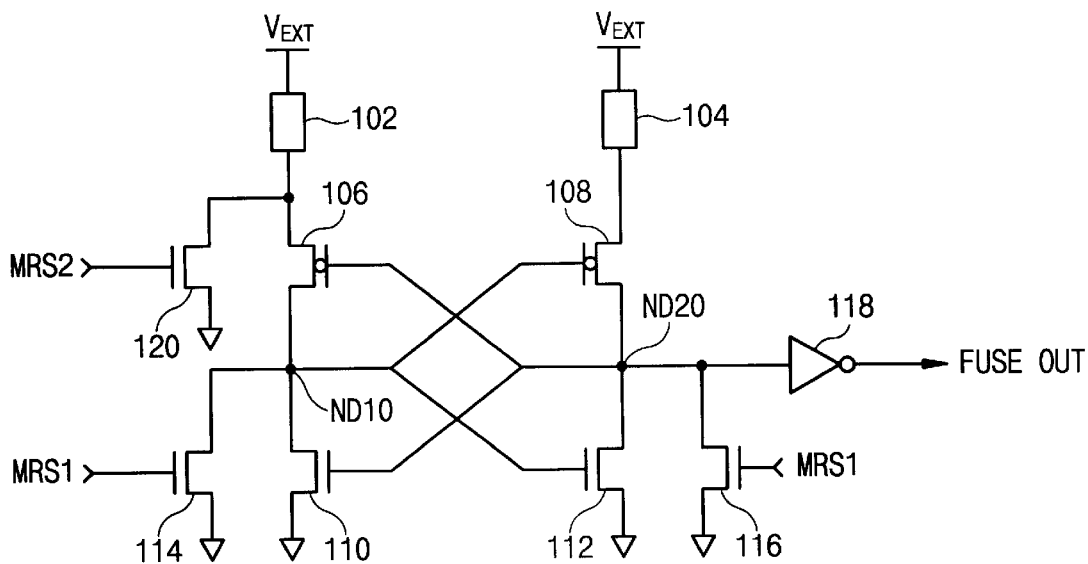
FIG. 2 is a circuit diagram showing a fuse circuit according to the present invention.
Figure 3:
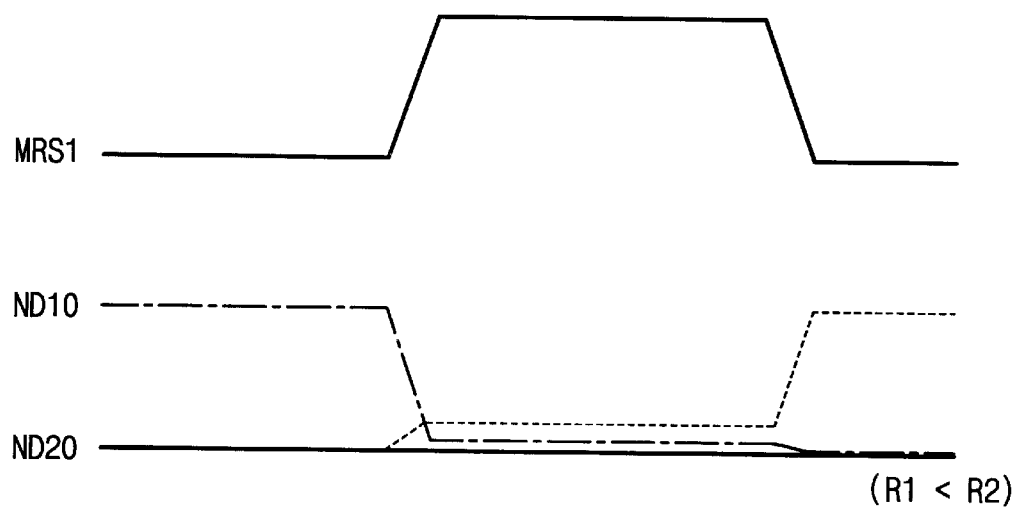
FIG. 3 is a diagram showing a voltage variation of respective control nodes in FIG. 2 according to a control signal.

FIG. 3 is a diagram showing a voltage variation of respective control nodes in FIG. 2 according to a control pulse signal. An operation of a fuse circuit according to the present invention will be more fully described with reference to accompanying drawings.

Assume that a resistor value (hereinafter, referred to as "R1") of the fuse resistor element 102 functioning as an electrically programmable fuse element is less than that of the fuse resistor element 104 functioning as a resistor. Under this condition, after a power is applied, voltage levels of the nodes ND10 and ND20 of the fuse circuit 100, as illustrated in FIG. 3, are determined according to capacitive parasitic loading of the respective node ND10 and ND20. Then, as the control pulse signal MRS1 transitions from a low level to a high level, the NMOS transistors 114 and 116 are turned on. As a result, according to a current sense operation of the PMOS and NMOS transistors 106, 108, 114 and 116 operating as a current sense amplifier circuit, a fine voltage difference occurs between the nodes ND10 and ND20 by a resistor difference of the fuse resistor elements 102 and 104. Since the resistor value R1 of the fuse resistor element 102 is less than that, R2 of the fuse resistor element 104 or since current from the elements having different resistor values are constantly discharged through the NMOS transistors 114 and 116 regardless of capacitive parasitic loading of the respective nodes ND10 and ND20, the voltage of the node ND10 is set higher than that of the node ND20 as a result of the current sense operation.

After a time elapses, the control pulse signal MRS1 transitions from a high level to a low level. The voltages of the nodes ND10 and ND20 set according to the result of the above-described current sense operation turns into rail-to-rail voltages, that is, a power supply voltage $V_{EXT}$ and a&ground voltage GND, by a complementary latch operation of the PMOS and NMOS transistors 106, 108, 110 and 112. That is, since the voltage of the node ND10 is relatively higher than that of the node ND20, the PMOS and NMOS transistors 106 and 112 are turned on, while the PMOS and NMOS transistors 108 and 110 are turned off. Therefore, while the voltage of the node ND10 goes to the power supply voltage $V_{EXT}$ through the fuse resistor element 102 and the PMOS transistor 106, the voltage of the node ND20 goes to the ground voltage GND through the NMOS transistor 112. Thus, the fuse circuit 100 outputs a signal FUSE OUT of a high level indicating that the fuse resistor element 102 is not programmed.

Assume that the fuse resistor element 102 is programmed in the same manner as described above so that the resistor value R1 of the fuse resistor element 102 is set some more than that of the fuse resistor element. Under this condition, as the control pulse signal MRS1 transitions from a low level to a high level, the NMOS transistors 114 and 116 are turned on. As a result, according to the current sense operation of the PMOS and NMOS transistors 106, 108, 114 and 116, a fine voltage difference occurs between the nodes ND10 and ND20 by a resistor difference of the fuse resistor elements 102 and 104. Since the resistor value R1 of the fuse resistor element 102 is larger than that R2 of the fuse resistor element 104, the voltage of the node ND20 is set higher than that of the node ND20 as the result of the current sense operation.

After a time elapses, the control pulse signal MRS1 transitions from a high level to a low level. The voltages of the nodes ND10 and ND20 set according to the result of the above-described current sense operation turns into rail-to-rail voltages, that is, the ground voltage GND and the power supply voltage $V_{EXT}$, by a complementary latch operation of the PMOS and NMOS transistors 106, 108, 110 and 112. That is, since the voltage of the node ND10 is relatively lower than that of the node ND20, the PMOS and NMOS transistors 106 and 112 are turned off, while the PMOS and NMOS transistors 108 and 110 are turned on. Therefore, while the voltage of the node ND20 goes to the power supply voltage $V_{EXT}$ through the fuse resistor element 104 and the PMOS transistor 108, the voltage of the node ND1 0 goes to the ground voltage GND through the NMOS transistor 110. Thus, the fuse circuit 100 outputs a signal FUSE OUT of a low level indicating that the fuse resistor element 102 is programmed.

The fuse circuit according to the preferred embodiment of the present invention exactly senses whether the fuse element 102 is programmed regardless of capacitive parasitic loading of the respective nodes ND10 and ND20, because there is used a scheme of sensing a resistor difference of the fuse resistor elements 102 and 104 according to a current difference instead of a scheme of sensing the resistor difference thereof according to a voltage difference. Therefore, a reliability problem occurred at the conventional fuse circuit is perfectly solved. Additionally, no current consumption exists by the fuse circuit 100 while the control pulse signal MRS1 is maintained at a low level. That is, no current path exists between the power supply voltage and the ground voltage.

Figure 4:
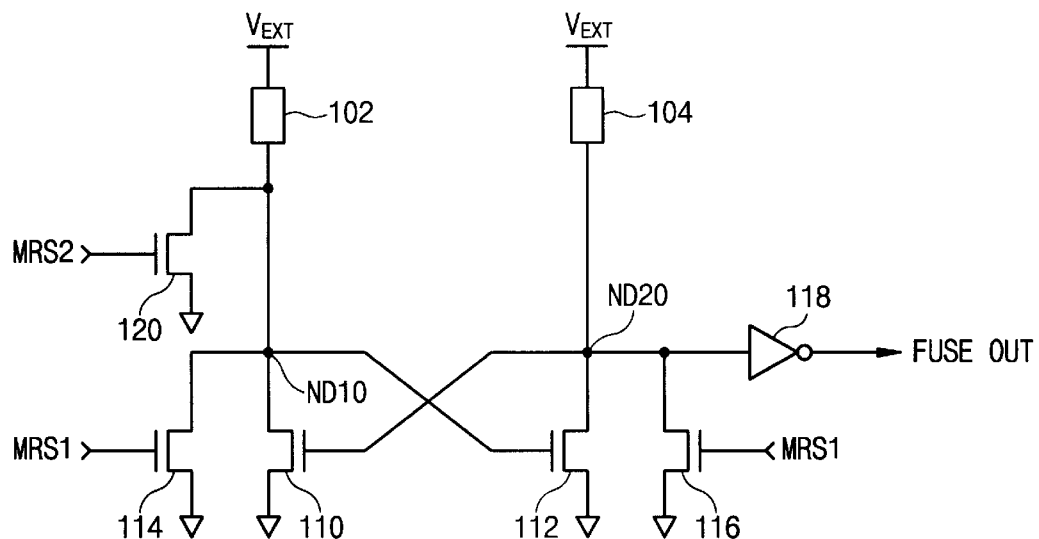
FIGS. 4 to 6 are circuit diagrams showing fuse circuits according to other embodiments of the present invention.
Figure 5:
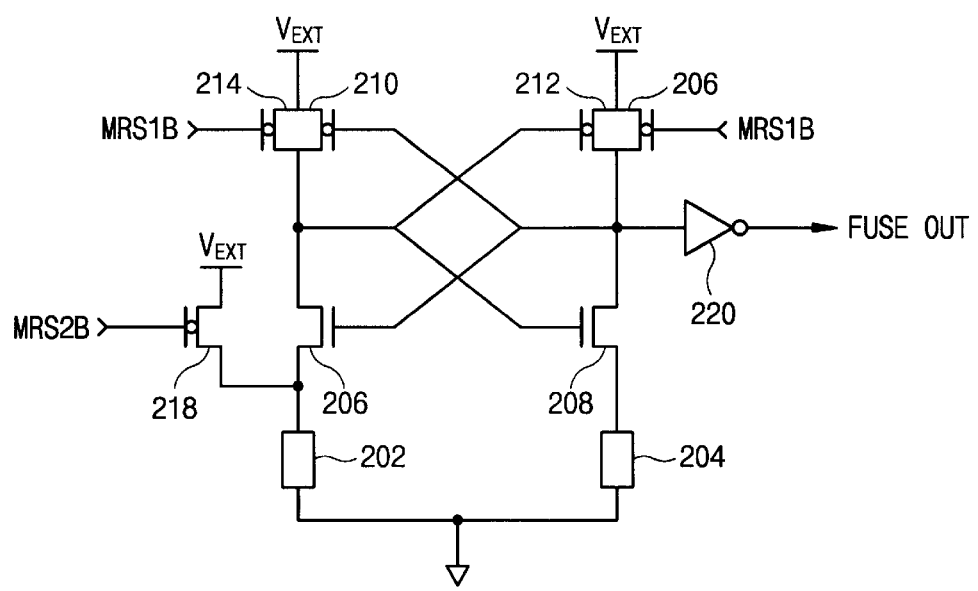
Figure 6:
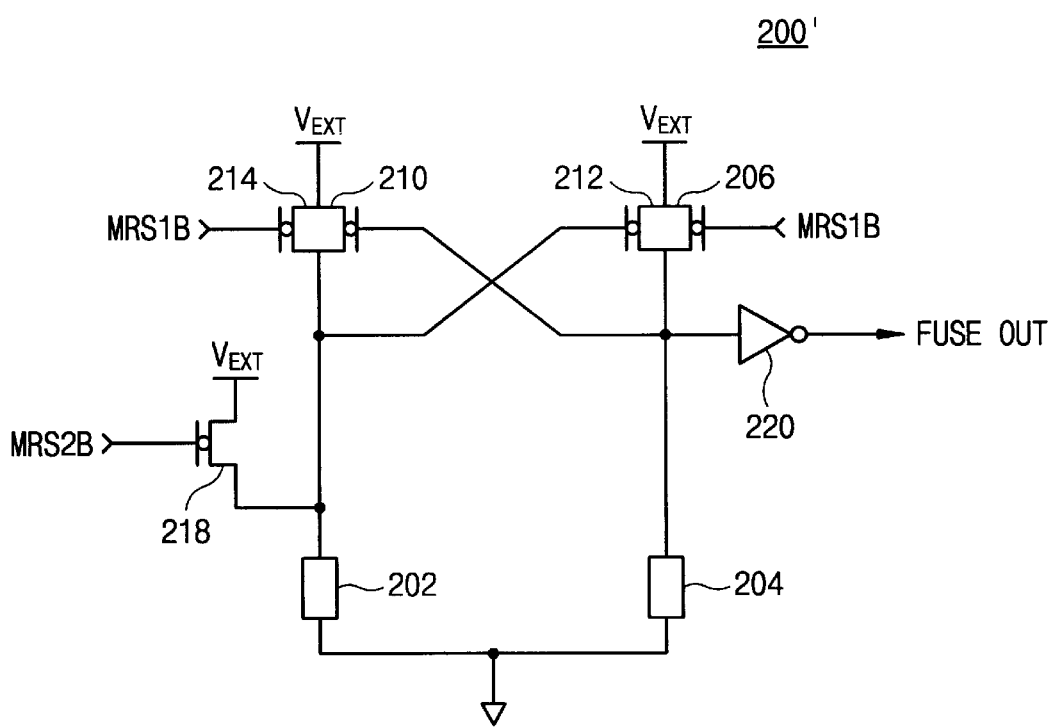

Fuse circuits according to other embodiments of the present invention are illustrated in FIGS. 4 to 6, respectively. The fuse circuit 100' in FIG. 4 is identical to that in FIG. 2 except that the PMOS transistors 106 and 108 are removed, and description thereof is thus omitted.

The fuse circuit 200 in FIG. 5 is different from that in FIG. 2 in the fact that the fuse resistor elements 202 and 204 are connected to the ground voltage and the PMOS transistors 210 and 212 forming a latch circuit are connected to the power supply voltage $V_{EXT}$. According to this circuit construction, the control pulse signal MRS1B of an active low and the fuse program pulse signal MRS2B of an active low are used in the fuse circuit 200 in FIG. 5. Since an operation of the fuse circuit 200 in FIG. 5 is identical to that in FIG. 2, description thereof is thus omitted. The fuse circuit 200' in FIG. 6 is identical to that in FIG. 4 expect that the NMOS transistors 206 and 208 of the fuse circuit 200 in FIG. 5 are removed. Thus, it is obvious to ones skilled in the art that the fuse circuits 100', 200 and 200' in FIGS. 4 to 6 have the same effect as the fuse circuit 100 in FIG. 2.

The fuse circuit according to the present invention can be used very usefully not only in a package level but also in a wafer level, because whether the electrically programmable fuse element is programmed is exactly discriminated. For example, if a defect occurs at a 1-bit memory cell of a packaged semiconductor memory, the semiconductor memory is discarded (or is not used). However, by realizing at a semiconductor memory a redundancy scheme to the 1-bit memory cell using the fuse circuit having improved reliability, the semiconductor memory to be discarded is relieved at the package level.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A fuse option circuit comprising:
   a first fuse element having first and second terminals, the first terminal of the first fuse element connected to a first power terminal;
   a second fuse element having first and second terminals, the first terminal of the second fuse element connected to the first power terminal;
   first and second nodes connected to the second terminals of the first and second fuse elements, respectively;
   a current sensing circuit coupled to the first and second fuse elements and structured to sense a difference of currents in the first and second fuse elements, and to set voltages of the first and second nodes depending on the current difference thus sensed; the current sensing circuit including a first transistor coupled between the first node and a second power terminal, and including a second transistor coupled between the second node and the second power terminal; and
   an amplifier structured to amplify voltages of the first and second nodes to the level of voltages of the first and second power terminals or to voltages of the second and first power terminals, respectively.

2. The fuse option circuit according to claim 1, wherein the first and second fuse elements have different resistance values from each other.

3. The fuse option circuit according to claim 1, wherein the first power terminal is provided with a power supply voltage and the second power terminal is provided with a ground voltage.

4. The fuse option circuit according to claim 1, wherein the first power terminal is provided with a ground voltage and the second power terminal is provided with a power supply voltage.

5. The fuse option circuit according to claim 3 or 4, wherein the first and second transistors are structured to be substantially simultaneously switched on/off according to a control pulse signal.

6. The fuse option circuit according to claim 5, wherein the amplifier comprises:
a third transistor which has a current path formed between the first node and the second power terminal and a gate electrode coupled to the second node; and
a fourth transistor which has a current path formed between the second node and the second power terminal and a gate electrode coupled to the first node, wherein the third and fourth transistors serve as a latch circuit.

7. The fuse option circuit according to claim 6, further comprising:
a fifth transistor which has a current path formed between the second terminal of the first fuse element and the first node and a gate electrode coupled to the second node; and
a sixth transistor which has a current path formed between the second terminal of the second fuse element and the second node and a gate electrode coupled to the first node, wherein the fifth and sixth transistors serve as a latch circuit.

8. The fuse option circuit according to claim 7, further comprising a program transistor coupled between the second terminal of the first fuse element and the second power terminal and switched on/off according to a fuse program pulse signal.

9. The fuse option circuit according to claim 8, further comprising an inverter which is coupled to the second node and outputs an output signal of the fuse option circuit according to a voltage level of the second node.

10. A fuse option circuit comprises:
a first fuse element having first and second terminals, wherein the first terminal of the first fuse element is connected to a power supply voltage; a second fuse element having first and second terminals, wherein the first terminal of the second fuse element is connected to the power supply voltage;
a first PMOS transistor which has a source electrode coupled to the second terminal of the first fuse element, a drain electrode coupled to a first node, and a gate electrode coupled to a second node;
a second PMOS transistor which has a source electrode coupled to the second terminal of the second fuse element, a drain electrode coupled to the second node, and a gate electrode coupled to the first node;
a first NMOS transistor which has a current path formed between the first node and a ground voltage and a gate electrode coupled to the second node;
a second NMOS transistor which has a current path formed between the second node and the ground voltage and a gate electrode coupled to the first node;
a third NMOS transistor which has a current path formed between the first node and the ground voltage and a gate electrode coupled to receive a control pulse signal; and
a fourth NMOS transistor which has a current path formed between the second node and the ground voltage and a gate electrode coupled to receive the control pulse signal.

11. The fuse option circuit according to claim 10, further comprising a program transistor coupled between the second terminal of the first fuses element and the ground voltage, the program transistor being switched on/off according to a fuse program pulse signal.

12. The fuse option circuit according to claim 10, further comprising an inverter coupled to the second node, outputting -the inverter an output signal of the fuse option circuit according to a voltage level of the second node.

13. The fuse option circuit according to claim 10, wherein the first and second fuse elements are configured to have different resistance values from each other.

14. A fuse option circuit comprising:
a first fuse element having first and second terminals, wherein the first terminal of the first fuse element is connected to a ground voltage;
a second fuse element having first and second terminals, wherein the first terminal of the second fuse element is connected to the ground voltage;
a first PMOS transistor which has a source electrode coupled to a power supply voltage, a drain electrode coupled to a first node, and a gate electrode coupled to a second node;
a second PMOS transistor which has a source electrode coupled to the power supply voltage, a drain electrode coupled to the second node, and a gate electrode coupled to the first node;
a third PMOS transistor which has a current path formed between the power supply voltage and the first node and a gate electrode coupled to receive a control pulse signal;
a fourth PMOS transistor which has a current path formed between the power supply voltage and the second node and a gate electrode coupled to receive the control pulse signal;
a first NMOS transistor which has a current path formed between the first node and the second terminal of the first fuse element and a gate electrode coupled to the second node; and
a second NMOS transistor which has a current path formed between the second node and the second terminal of the second fuse element and a gate electrode coupled to the first node.

15. The fuse option circuit according to claim 14, further comprising a program transistor coupled between the power supply voltage and the second terminal of the first fuse element and switched on/off according to a fuse program pulse signal.

16. The fuse option circuit according to claim 14, further comprising an inverter which is coupled to the second node and outputs an output signal of the fuse option circuit according to a voltage level of the second node.

17. The fuse option circuit according to claim 14, wherein the first and second fuse elements are configured to have different resistance values from each other.

18. A method for discriminating a program status of a fuse circuit in response to a control pulse signal, the method comprising:
providing first and second fuse elements, each of which has one end connected to a first power terminal, a second end of the first fuse element coupled to a first node and a second end of the second fuse element coupled to a second node;
establishing voltages at the first and second nodes;
allowing electrical currents to flow through the first and second fuse elements;
sensing a difference of currents flowing through the first and second fuse elements when the control pulse signal has a first logic level and setting a voltage difference between the first and second nodes according to the current difference thus sensed; and amplifying voltages of the first and second nodes to the level of voltages of the first power terminal and a second power terminal, or to the level of the second and the first power terminals, respectively, when the control pulse signal has a second logic level.

19. The method according to claim 18, wherein the first and second fuse elements may have different resistance values from each other.

20. The method according to claim 18 wherein setting voltages at the first and second nodes comprises setting the first and second nodes to the same voltage.

21. The method according to claim 18 wherein setting voltages at the first and second nodes comprises:

applying the control pulse signal to a control node of a first transistor coupled between the first node and a reference voltage, and applying the control pulse signal to a control node of a second transistor coupled between the second node and the reference voltage.

* * * * *